(12) United States Patent
Chen et al.

(10) Patent No.: US 6,287,963 B1
(45) Date of Patent: *Sep. 11, 2001

(54) METHOD FOR FORMING A METAL CONTACT

(75) Inventors: Fusen E. Chen, Dallas; Fu-Tai Liou, Carrollton; Girish A. Dixit, Dallas; Che-Chia Wei, Plano, all of TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/418,257

(22) Filed: Apr. 6, 1995

Related U.S. Application Data

(63) Continuation of application No. 08/146,824, filed on Nov. 1, 1993, now abandoned, which is a continuation of application No. 07/824,238, filed on Jan. 21, 1992, now abandoned, which is a continuation-in-part of application No. 07/609,883, filed on Nov. 5, 1990, now Pat. No. 5,108,951.

(51) Int. Cl.$^7$ .................... H01L 21/4763; H01L 21/44
(52) U.S. Cl. ............................ 438/643; 438/688
(58) Field of Search .................. 437/194, 197, 437/203, 187, 247; 148/DIG. 25, DIG. 158; 204/192.1; 427/97, 96

(56) References Cited

U.S. PATENT DOCUMENTS

| | | | |
|---|---|---|---|
| 3,158,504 | 11/1964 | Anderson | 117/213 |
| 3,900,598 | 8/1975 | Hall et al. | 427/90 |

(List continued on next page.)

FOREIGN PATENT DOCUMENTS

| | | |
|---|---|---|
| 0 107 259 A3 | 5/1984 | (EP) . |
| 0 132 720 A1 | 2/1985 | (EP) . |
| 0 137 701 A1 | 4/1985 | (EP) . |
| 0 168 828 A2 | 1/1986 | (EP) . |
| 0 257 277 A2 | 3/1988 | (EP) . |
| 0 269 019 A3 | 6/1988 | (EP) . |
| 0 273 715 A2 | 7/1988 | (EP) . |
| 0 276 087 A2 | 7/1988 | (EP) . |
| 0 310 108 A2 | 4/1989 | (EP) . |
| 0 329 227 A1 | 8/1989 | (EP) . |
| 0 488 628 A2 | 11/1990 | (EP) . |
| 0 430 403 A2 | 6/1991 | (EP) . |
| 0 451 571 A2 | 10/1991 | (EP) . |
| 0 488 264 A3 | 6/1992 | (EP) . |
| 0 499 241 A1 | 8/1992 | (EP) . |
| 2 112 566 | 7/1983 | (GB) . |
| 2 128 636 | 5/1984 | (GB) . |
| 54-71564 | 8/1979 | (JP) . |
| 57-139939 | 8/1982 | (JP) . |
| 58-46641 | 1/1983 | (JP) . |
| 60-227446 | 11/1985 | (JP) . |
| 61-142739 | 6/1986 | (JP) . |
| 63-124447 | 5/1988 | (JP) . |
| 63-136547 | 6/1988 | (JP) . |
| 2-137230 | 11/1988 | (JP) . |
| 1-160036 | 6/1989 | (JP) . |
| 1-077122 | 9/1989 | (JP) . |

OTHER PUBLICATIONS

Wolf et al: "Aluminum Thin Films and Physical Vapor Deposition in VLSI"; "Silicon Processing for the VLSI Era"; Lattice Press, 1986 pp. 332–334 and 367–374.*

(List continued on next page.)

*Primary Examiner*—David E. Graybill
(74) *Attorney, Agent, or Firm*—Theodore E Galanthay; Lisa K Jorgenson; Daniel E. Venglarik

(57) ABSTRACT

A method is provided for depositing aluminum thin film layers to form contacts in a semiconductor integrated circuit device. All or some of the deposition process occurs at relatively low deposition rates at a temperature which allows surface migration of the deposited aluminum atoms. Aluminum deposited under these conditions tends to fill contact vias without the formation of voids. The deposition step is periodically interrupted.

21 Claims, 2 Drawing Sheets

U.S. PATENT DOCUMENTS

| | | | |
|---|---|---|---|
| 4,107,726 | | 8/1978 | Schilling .............................. 357/71 |
| 4,436,582 | | 3/1984 | Saxena ................................. 156/656 |
| 4,502,209 | | 3/1985 | Eizenberg et al. .................... 427/88 |
| 4,566,177 | | 1/1986 | van de Ven .......................... 148/188 |
| 4,661,228 | | 4/1987 | Mintz ............................... 204/192.24 |
| 4,756,810 | * | 7/1988 | Lamont, Jr. et al. ........... 204/192.32 |
| 4,758,533 | | 7/1988 | Magee et al. ........................ 437/173 |
| 4,772,571 | | 9/1988 | Scovell et al. ....................... 437/200 |
| 4,837,183 | * | 6/1989 | Polito et al. ......................... 437/198 |
| 4,892,844 | | 1/1990 | Cheung ................................ 437/194 |
| 4,944,961 | * | 7/1990 | Lu et al. .............................. 427/314 |
| 4,970,176 | | 11/1990 | Tracy et al. .......................... 437/187 |
| 4,975,389 | | 12/1990 | Ryan et al. ........................... 437/197 |
| 4,976,839 | | 12/1990 | Inoue ............................... 204/192.17 |
| 4,988,423 | | 1/1991 | Yamamoto ...................... 204/192.17 |
| 4,991,462 | * | 2/1991 | Armstrong et al. ............ 204/192.15 |
| 4,994,162 | * | 2/1991 | Armstrong et al. ............ 204/192.12 |
| 5,106,781 | | 4/1992 | DeVries ............................... 437/192 |
| 5,108,570 | * | 4/1992 | Wang .............................. 204/192.15 |
| 5,108,951 | | 4/1992 | Chen et al. .......................... 437/187 |

OTHER PUBLICATIONS

TiN Metallization Barriers: From 1.2μ to 0.35μ Technology Fabio Pintchovski and Ed Travis, Motorola, Inc., Austin, Texas pp. 777–786, 1992 Materials Research Society.

Development of a Planarized Al–Sl Contact Filling Technology Hisako Ono, et al., VMIC Conference, Jun. 1990, pp. 76–82.

Aluminum Metallization for ULSI, Dipankar Pramanik et al., Solid State Technology Mar. 1990, No. 3, Westford, MA. pp. 73–79.

Thin–film reactions of Al with Co, Cr, Mo, Ta, Ti, and W E. G. Colgan, et al., vol. 4, No. 1989 Materials Research Society, pp. 815–820 date unavailable.

Planarized Aluminum Deposition on TiW and TiN Layers by High Temperature Evaporation, G. E. Georgiou, et al., AT&T Bell Laboratories, Jun. 1989 VMIC Conference, pp. 315–321.

The properties of aluminum thin films sputter deposited at elevated temperatures, M. Inoue et al., J. Vac. Sci. Technol. May 6, 1988, pp. 1636–1939.

Evaluation of Titanium as a Diffusion Barrier Between Aluminum And Silicon for 1.2 μm CMOS Integrated Circuits, M. Farahani, et al., Electrochemical Society Active Member, pp. 2835–2845 date unavailable.

Nonconformal Al Via Filling and Planarization by Partially Ionized Beam Deposition for Multilevel Interconnection, S. N. Mei, et al., 1987 IEEE, pp. 503–505.

Aluminum Alloy Planarization for Topography Control of Multi–level VLSI Interconnect, van Gogh, et al., 1987 IEEE, pp. 371–375.

Interconnect Materials for VLSI Circuits, Y. Pauleau, Centre National d'Etudes des Telecommunications, Meylan, France 1987, pp. 155–162.

Planarization of Al Alloy Film During High Rate Sputtering, V. Hoffman, et al., Mar. 1986, Report No. 122, pp. 1–20.

Sputtering and Interconnect Trends, Peter Burggraaf, Semiconductor International, Nov. 1984, pp. 70–73.

TiN formed by evaporation as a diffusion barrier between Al and Si, C. Y. Ting, IBM T. J. Watson Research Center, Yorktown Heights, New York 10598, May 6, 1982, pp. 14–18.

High–temperature contact structures for silicon semiconductor devices, M. Wittmer, Brown Boveri Research Center, 5405 Baden–Dattwil, Switzerland, 9/80 pp. 540–542.

* cited by examiner

METHOD FOR FORMING A METAL CONTACT

CROSS REFERENCE TO RELATED APPLICATIONS

This application is a continuation of Ser. No. 08/146,824 filed Nov. 1, 1993, abandoned; which is a continuation of Ser. No. 07/824,238 filed Jan. 21, 1992, abandoned; which is a continuation in part of Ser. No. 07/609,883 filed Nov. 5, 1990, now U.S. Pat. No. 5,108,951.

BACKGROUND OF THE INVENTION

1. Field of the Invention

The present invention relates generally to semiconductor integrated circuits, and more specifically to a method for depositing metal layers in integrated circuits so as to form an improved interlevel contact.

2. Description of the Prior Art

In semiconductor integrated circuits, formation of metal interconnect layers is important to the proper operation of these devices. Metal interconnect signal lines make contact to lower conductive layers of the integrated circuit through vias in an insulating layer. For best operation of the device, the metal used to form the interconnect layer should completely fill the via.

Because of its physical properties, aluminum is especially suited for fabrication of metal interconnect lines in integrated circuits. As known in the art and illustrated by the Ono article cited below, aluminum is typically alloyed with small amounts of materials such as silicon. However, the sputtering process used to apply aluminum thin film layers to an integrated circuit generally results in less than ideal filling of contact vias. Large aluminum grains tend to form on the upper surface of the insulating layer. Those grains which form at the edges of the contact via tend to block it before aluminum has a chance to completely fill the via. This results in voids and uneven structures within the via.

This problem is especially acute as integrated circuit devices are fabricated using smaller geometries. The smaller contacts used in these devices tend to have a larger aspect ratio (height to width ratio) than larger geometry devices, which exacerbates the aluminum filling problem.

The uneven thickness of the aluminum layer going into the via, caused by the step coverage problem just described, has an adverse impact on device functionality. If the voids in the via are large enough, contact resistance can be significantly higher than desired. In addition, the thinner regions of the aluminum layer will be subject the well known electromigration problem. This can cause eventual open circuits at the contacts and failure of the device.

Many approaches have been used to try to ensure good metal contact to lower interconnect levels. For example, refractory metal layers have been used in conjunction with the aluminum interconnect layer to improve conduction through a via. Sloped via sidewalls have been used to improve metal filling in the via. The use of sloped sidewalls is becoming less common as device sizes shrink because they consume too much area on a chip.

One technique which has been proposed to overcome the via filling problem is to deposit the aluminum interconnect layers at a temperature between 500° C. and 550° C. At these temperatures, the liquidity of the aluminum is increased, allowing it to flow down into the vias and fill them. This technique is described, for example, in DEVELOPMENT OF A PLANARIZED Al—Si CONTACT FILLING TECHNOLOGY, H. Ono et al, June 1990 VMIC Conference proceedings, pages 76–82. This references teaches that temperatures below 500° C. and above 550° C. result in degraded metal filling of contact vias. It is believed that use of such technique still suffers from problems caused by large grain sizes.

Even with these techniques, the problems of completely filling a via with aluminum are not solved. In part this is due to the fact that aluminum is deposited at a low rate, which tends to encourage larger grain sizes. Voids and other irregularities within the contact continue to be problems with current technologies.

It would be desirable to provide a technique for depositing aluminum thin film layers on an integrated circuit so as to improve coverage in contact vias. It is also desirable that this technique provide a smooth aluminum surface which is easily patterned. It is further desirable that such a technique be compatible with current standard process flows.

SUMMARY OF THE INVENTION

Therefore, according to the present invention, a method is provided for depositing aluminum thin film layers to form improved quality contacts in a semiconductor integrated circuit device. All or some of the deposition process occurs at relatively low deposition rates at a temperature which allows improved surface migration of the deposited aluminum atoms. Aluminum deposited under these conditions tends to fill contact vias without the formation of voids. In order to improve the surface smoothness of the deposited aluminum, the deposition step is periodically interrupted.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
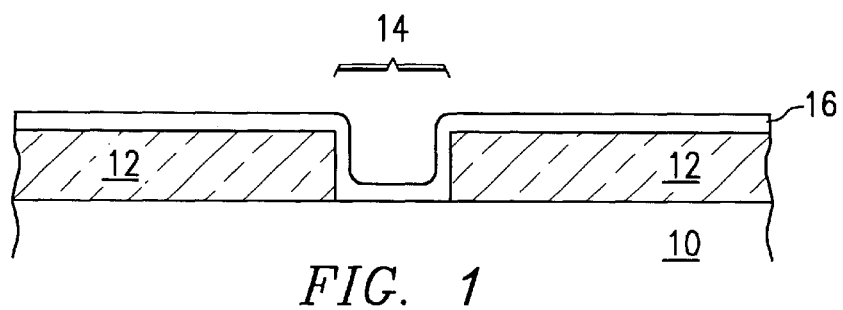
FIGS. 1 and 2 illustrate the formation of a metallic contact according to the present invention.

Referring to FIG. 1, an integrated circuit device is formed in and on a substrate 10. An insulating layer 12, such as a a reflow glass or other oxide layer as known in the art, is formed over the substrate 10. Layer 12 typically has a thickness on the order of approximately 6000–12,000 angstroms. A contact via 14 is formed through the oxide layer 12 using a mask and an isotropic etching technique as known in the art. Via 14 is shown as making contact with substrate 10 in FIG. 1, but may be formed over a lower interconnect layer as known in the art.

A barrier metal layer 16, such as a refractory metal, refractory metal nitride, refractory metal silicide, or combination thereof, is deposited over the surface of the device as known in the art. Layer 16 is relatively thin, typically approximately 500–2000 angstroms thick, and is deposited conformally to cover the bottom and sidewalls of contact opening 14.

Figure 2:
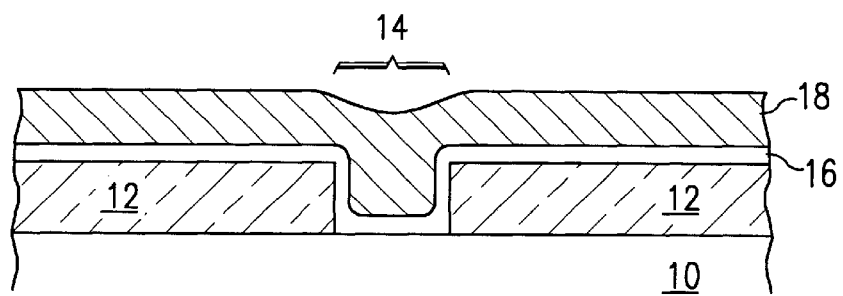

Referring to FIG. 2, an aluminum layer 18 is deposited over the surface of the device. When the aluminum layer 18 is deposited using the process conditions described below, the layer 18 actually completely fills in the via 14 as shown in FIG. 2. This occurs because the preferred process conditions enhance the surface migration of the deposited aluminum atoms, so that aluminum formation in the bottom of the via 14 occurs preferentially to formation on the oxide layer 12 near the edges of the via 14. This ensures a high quality, reproducible contact within the via 14, greatly minimizing the problems caused by incomplete filling of the via 14.

Figure 3:
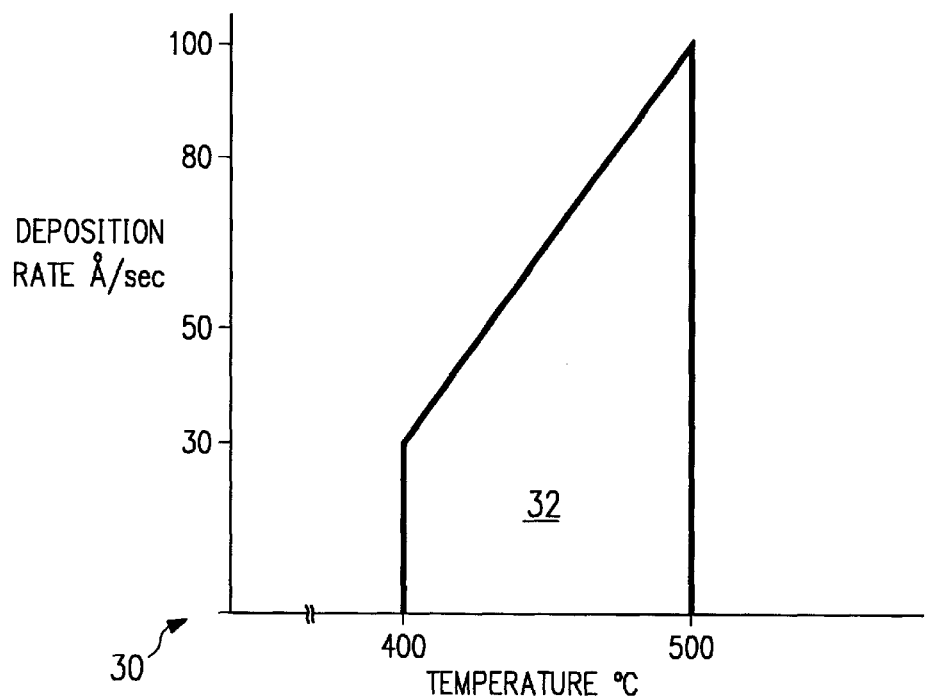
FIG. 3 is a graph illustrating preferred process conditions for formation of an aluminum contact.

FIGS. 3 and 4 illustrate preferred conditions for deposition of the aluminum layer 18 in order to provide an improved contact. Graph 30 illustrates the deposition rate, in angstroms per second, as a function of the deposition temperature in degrees Celsius. The preferred region 32 lies between 400° C.–500° C., with the maximum deposition rate lying below a line extending from a rate of about 30 angstroms per second at 400° C. to 100 angstroms per second at 500° C.

When aluminum is deposited within this preferred region 32, its surface migration characteristics are enhanced over metal deposited under other conditions. For example, depositing aluminum at temperatures higher than 500° C. tends to form large grains, so that blocking of the contact opening occurs as described earlier. If the deposition rate is too high, the deposited aluminum is not able to migrate quickly enough into the via to completely fill it. Therefore, the region 32 depicted in FIG. 3 outlines, approximately, a preferred pairing of processing conditions under which deposited aluminum migrates into the contact via and fills it while minimizing the formation of voids and uneven regions.

Process conditions can be varied slightly from that shown in FIG. 3 without departing from the teachings of the present invention. For example, temperatures a little below 400° C. can be used, as long as the deposition rates are not too high. As the temperature decreases, the mobility of the deposited aluminum atoms goes down, so that incomplete filling of the via occurs if the deposition rates are too high.

FIG. 4 includes four graphs illustrating preferred processes by which an aluminum interconnect layer can be formed. All of these processes utilize, to a greater or lesser degree, processing which occurs within the preferred region 32. Each of the curves 40, 42, 44, 46 illustrates a variation in the aluminum deposition rate with time. Each curve 40–46 illustrates an alternative process utilizing the concepts of the present invention.

Each of the four processes shown in FIG. 4 preferably uses approximately the same set of initial conditions. In the prior art, it is common to deposit a very thin layer of small grain aluminum at a relatively cold temperature, typically below 350° C., and then stop the deposition process. The wafer on which the integrated circuit device is located is then preheated to the required deposition temperature, over 500° C., by bathing the wafer with a stream of preheated argon gas. Once the wafer has reached the deposition temperature, deposition of the aluminum is resumed at such elevated temperature.

In the present technique, aluminum is preferably deposited on the device continuously while the device is being heated. Thus, a small amount of aluminum is deposited on the device while the wafer is at or below 350° C. As the wafer gradually heats to the desired deposition temperature, aluminum deposition continues. This gives a layer of aluminum which is deposited with very small grain sizes, tending to minimize grain size growth at later stages. The deposition temperature is between 400° C. and 500° C., and is typically reached in about 40 seconds.

FIG. 4 shows deposition rate curves for four alternative deposition techniques. For all of the curves in FIG. 4, the initial temperature of the wafer is assumed to be approximately 350° C., with the final deposition temperature being 450° C. Heating the wafer to 450° C. takes approximately 40 seconds. It will be appreciated by those skilled in the art that different deposition temperatures may be used. Once the wafer has heated to the deposition temperature, the temperature remains constant.

Figure 4A:
FIG. 4a–4d illustrate several alternative deposition rate diagrams for forming contacts according to the present invention.

Curve 40 in FIG. 4(a) depicts a deposition process in which the deposition rate stays constant during the entire course of depositing the aluminum layer 18. Deposition begins when heat is first applied to the wafer in the chamber, and continues while the wafer heats to 450° C. and remains there. At a rate of 40 angstroms per second, an 8000 angstrom thick aluminum layer will take approximately 200 seconds to deposit.

Figure 4B:
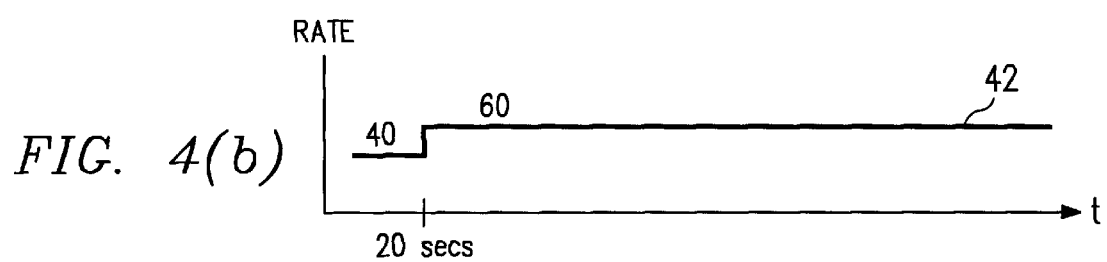

FIG. 4(b) shows an alternative deposition process in which the deposition rate is performed at 40 angstroms per second for the first 20 seconds, and 60 angstroms per second thereafter. The temperature is increasing toward the 450° C. point during the entire deposition step at 40 angstroms per second, and for the first 20 seconds at 60 angstroms per second. For an 8000 angstrom layer, the process curve 42 will result in an aluminum layer formation process which takes approximately 140 seconds.

Curve 44 shows a process in which the initial deposition rate is 40 angstroms per second, followed by an increase to 80 angstroms per second after 20 seconds. After approximately one-third of the entire thickness of the aluminum layer has been deposited, the deposition rate is changed to 30 angstroms per second. This rate is maintained for the deposition of approximately another one-third of the entire layer thickness, followed by an increase of the deposition rate back to 80 angstroms per second.

Figure 4C:
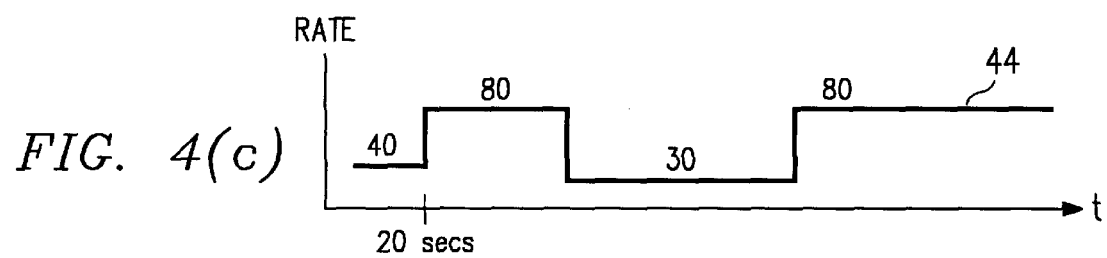

The process depicted by curve 44 will take approximately 160 seconds to deposit an 8000 angstrom layer of aluminum. This assumes that 2400 angstroms are deposited during each of the 80 angstrom per second segments, and during the 30 angstrom per second segment. The process of FIG. 4(c) provides for an initial fast deposition of aluminum, followed by a slow deposition period in which deposited aluminum is given the opportunity to migrate into the contact opening. The 30 angstrom deposition period will last for approximately 80 seconds, in order to deposit 2400 angstroms.

Figure 4D:
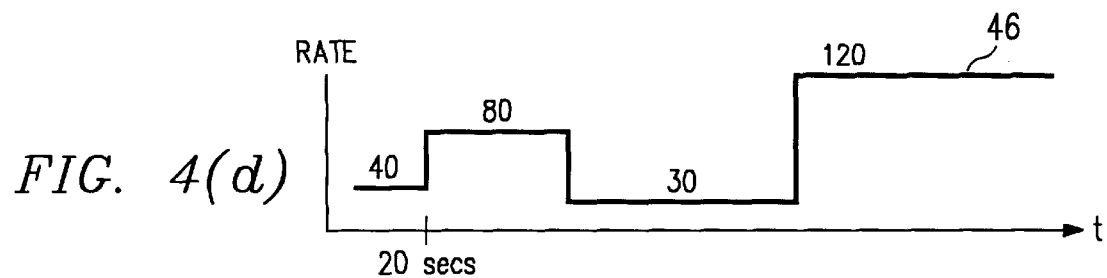

Curve 46 in FIG. 4(d) starts in the same manner as curve 44, but ends with a higher deposition rate. Processing time is saved by the faster deposition near the end of the process. By this point in the deposition process, the contact opening has been mostly filled, and the possibility of voiding in the via has been greatly decreased. Thus, there is no harm to depositing aluminum at a rate which falls outside of the preferred region 32.

It will be appreciated by those skilled in the art that the processes shown in FIG. 4 are illustrative and not definitive. Other variations are possible. The precise combination of deposition temperatures and deposition rates can be varied to suit the requirements and restrictions of the particular processes at hand. For example, if large contact openings only are used, faster deposition rates can be made as the voiding problem is not so critical. For processes such as those illustrated by curves 44 and 46, it is not necessary to adhere to a one-third thickness deposition at each rate. These rates and times may be varied to suit the requirements of a production process while still taking advantage of the concepts of the invention.

It is also possible to use the technique of depositing aluminum within the preferred area 32 without continuously depositing aluminum while the wafer temperature is ramping up to the deposition temperature. As is done on the prior art, a thin layer of aluminum can be deposited at relatively cold temperatures, preferably below 350° C. Deposition is then stopped while the wafer is brought to a temperature between 400° C. and 500° C. Deposition is then resumed at a rate within the preferred region 32, and completed using the teachings set forth above. For example, any of the curves in FIG. 4 can be used, with the difference that the initial 40 angstroms per second deposition rate is omitted.

Figure 5:
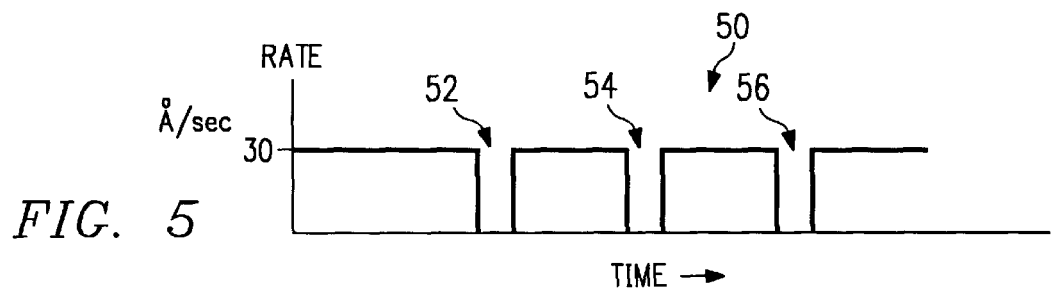
FIG. 5 is a deposition rate diagram illustrating an improved alternative deposition process.

Referring to FIG. 5, curve 50 illustrates an improved alternative process for depositing aluminum in accordance with the principles set forth above. It has been found that the process as described above provides excellent filling characteristics, with improved characteristics coming at lower deposition rates. However, very low deposition rates cause a somewhat roughened upper surface of the deposited aluminum layer. This roughened surface causes difficulty in patterning the deposited aluminum layer, due both to line width control problems caused by scattering and uneven etch rates.

It has been found that the deposition process illustrated by curve 50 in FIG. 5 provides the excellent coverage described above, and further results in a smooth surface on the deposited aluminum layer. Curve 50 provides for stopping deposition completely during selected intervals 52, 54, 56. As shown in FIG. 5, aluminum is otherwise deposited at a constant rate of 30 angstroms per second.

It is believed that periodically ceasing aluminum deposition entirely allows for some crystal growth to occur in the deposited aluminum layer, which tends to smooth out the upper surface of the final layer. As known in the art, a smoother metal surface allows easier and more accurate patterning of the deposited metal film.

Although FIG. 5 shows a deposition rate of 30 angstroms per second, other rates may be used. For example, a deposition rate of 50 or 60 angstroms per second can be utilized with the interrupted deposition concept described herein. In addition, variable deposition rates of the type described in connection with FIG. 4 may also be used, with the simple insertion of intervals 52–56 in which deposition is stopped entirely.

The number of intervals 52–56 which are used is not critical, although at least two intervals are preferably used. Each of the intervals 52–56 preferably has a duration of at least 20 seconds. The number of intervals used, and their duration, will need to be varied with the deposition rate and thickness of the deposited aluminum film. Thicker films will tend to require more and longer interruption intervals 52–56 in order to obtain a given smoothness of the final metal layer. As an example, one technique which gives good results uses five deposition interruption intervals of 60 seconds each.

In summary, by providing periodic stops during aluminum deposition as described above the smoothness of the resulting aluminum film can be improved. This makes later patterning of the aluminum easier while maintaining the excellent filling characteristics of the described process conditions.

While the invention has been particularly shown and described with reference to a preferred embodiment, it will be understood by those skilled in the art that various changes in form and detail may be made therein without departing from the spirit and scope of the invention.

What is claimed is:

1. A method for forming an aluminum contact in an integrated circuit, comprising the steps of:

forming an insulating layer over a conducting layer;

forming an opening through the insulating layer to expose a portion of the conducting layer;

forming a layer including a refractory metal over the insulating layer, and sidewalls and a bottom of the opening;

raising the temperature of the integrated circuit from below approximately 350° C. to a value between approximately 400° C. and approximately 500° C.;

during said step of raising the temperature, beginning to deposit aluminum on the layer including the refractory metal and in the opening;

after said step of raising the temperature, continuing said step of depositing aluminum, wherein aluminum is deposited at a temperature of between approximately 400° C. and approximately 500° C.;

during said steps of beginning to deposit aluminum and continuing depositing aluminum, controlling the rate at which aluminum is deposited to allow the deposited aluminum to migrate into the opening so as to provide a substantially complete fill thereof; and periodically interrupting said continuing step for a first time period.

2. The method of claim 1, wherein said continuing step comprises depositing the aluminum at a constant rate.

3. The method of claim 1, wherein said continuing step comprises depositing aluminum at a rate which changes over time.

4. The method of claim 1, wherein said interrupting step comprises the steps of:

stopping deposition of the aluminum during said continuing step;

maintaining the temperature of the integrated circuit;

at the end of the first time period, resuming aluminum deposition; and repeating said stopping, maintaining, and resuming steps.

5. The method of claim 4, wherein said stopping, maintaining, and resuming steps are performed more than twice during said continuing step.

6. The method of claim 5, wherein said stopping, maintaining, and resuming steps are performed at least five times during said continuing step.

7. The method of claim 4, wherein the selected time period has a duration of at least 20 seconds.

8. The method of claim 4, wherein the selected time period has a duration of at least 60 seconds.

9. The method of claim 4, wherein the selected time period has a duration which is the same for each interruption.

10. The method of claim 1, wherein said controlling step comprises the step of:

maintaining the deposition rate to be less than approximately $$(0.7 * T) - 250 \text{ angstroms/sec}$$

where T lies between approximately 400° C. and 500° C.

11. The method of claim 1, wherein said step of beginning to deposit aluminum begins approximately simultaneously with said step of raising the temperature.

12. A method for forming a contact in an integrated circuit, comprising the steps of:

forming an insulating layer over a conducting layer;

forming an opening through the insulating layer to expose a portion of the conducting layer;

forming a layer including a refractory metal over the insulating layer, and sidewalls and a bottom of the opening;

raising the temperature of the integrated circuit from below approximately 350° C. to a value between approximately 400° C. and approximately 500° C.;

aproximatelv simultaneously with said step of raising the temperature, beginning to deposit, by sputtering, a metallic material consisting essentially of aluminum on the layer including the refractory metal and in the opening;

after said step of raising the temperature, continuing said step of depositing the metallic material wherein the metallic material is deposited at a temperature of between approximately 400° C. and approximately 500° C.;

during said depositing and continuing steps, controlling the rate at which the metallic material is deposited to allow the deposited metallic material to migrate into the opening so as to provide a substantially complete fill thereof; and periodically interrupting said continuing step for a first time period.

13. The method of claim 12, wherein said continuing step comprises depositing the metallic material at a constant rate.

14. The method of claim 12, wherein said continuing step comprises depositing metallic material at a rate which changes over time.

15. The method of claim 12, wherein said interrupting step comprises the steps of:

stopping deposition of the metallic material during said continuing step;

maintaining the temperature of the integrated circuit;

at the end of the first time period, resuming deposition of the metallic material; and repeating said stopping, maintaining, and resuming steps.

16. The method of claim 15, wherein said stopping, maintaining, and resuming steps are performed more than twice during said continuing step.

17. The method of claim 16, wherein said stopping, maintaining, and resuming steps are performed at least five times during said continuing step.

18. The method of claim 15, wherein the selected time period has a duration of at least 20 seconds.

19. The method of claim 15, wherein the selected time period has a duration of at least 60 seconds.

20. The method of claim 15, wherein the selected time period has a duration which is the same for each interruption.

21. The method of claim 12, wherein said controlling step comprises the step of:

maintaining the deposition rate to be less than approximately $$(0.7 * T) - 250 \text{ angstroms/sec}$$

where T lies between approximately 400° C. and 500° C.

* * * * *